United States Patent
Blume et al.

(10) Patent No.: US 9,913,394 B2
(45) Date of Patent: Mar. 6, 2018

(54) ASSEMBLY FOR SECURING AT LEAST ONE EXPANSION CARD AND SERVER SYSTEM

(71) Applicant: FUJITSU LIMITED, Kawasaki-shi, Kanagawa (JP)

(72) Inventors: Johannes Blume, München (DE); Ronny Hesse, München (DE)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/320,602

(22) PCT Filed: Oct. 6, 2015

(86) PCT No.: PCT/EP2015/073049
§ 371 (c)(1),
(2) Date: Dec. 20, 2016

(87) PCT Pub. No.: WO2016/058868
PCT Pub. Date: Apr. 21, 2016

(65) Prior Publication Data
US 2017/0265323 A1    Sep. 14, 2017

(30) Foreign Application Priority Data
Oct. 13, 2014  (DE) .................. 10 2014 114 790

(51) Int. Cl.
*H05K 7/14* (2006.01)
*H01R 12/71* (2011.01)

(52) U.S. Cl.
CPC .......... *H05K 7/1487* (2013.01); *H01R 12/71* (2013.01); *H05K 7/1407* (2013.01); *H05K 7/1424* (2013.01)

(58) Field of Classification Search
CPC combination set(s) only.
See application file for complete search history.

(56) References Cited

U.S. PATENT DOCUMENTS

| 5,912,801 A * | 6/1999 | Roy ................... H05K 7/1418 312/223.1 |
| 6,709,276 B2 * | 3/2004 | Barringer ........... H05K 7/1424 211/41.1 |

(Continued)

FOREIGN PATENT DOCUMENTS

| DE | 20109095 | 11/2002 |
| DE | 202009002853 | 6/2009 |

(Continued)

*Primary Examiner* — Lisa Lea Edmonds
(74) *Attorney, Agent, or Firm* — Fujitsu Patent Center

(57) ABSTRACT

The invention relates to an assembly for securing at least one expansion card (comprising a half-open chassis for receiving a first circuit board of a server module having at least one first plug connector, a carrier component for receiving at least one expansion card and at least one second circuit board secured to the carrier component. The carrier component comprises at least one securing point for rotatably and releasably receiving the carrier component on the half-open chassis and at least one first bearing surface for supporting the carrier component on a second bearing surface of the half-open chassis, arranged in the region of opposite ends of the carrier component. Here, a first mating plug connector of the second circuit board is arranged such that the second circuit board is electrically connected to the first circuit board by receiving and pivoting the carrier component around the securing point.

20 Claims, 4 Drawing Sheets

(56) References Cited

U.S. PATENT DOCUMENTS

Figure 1:
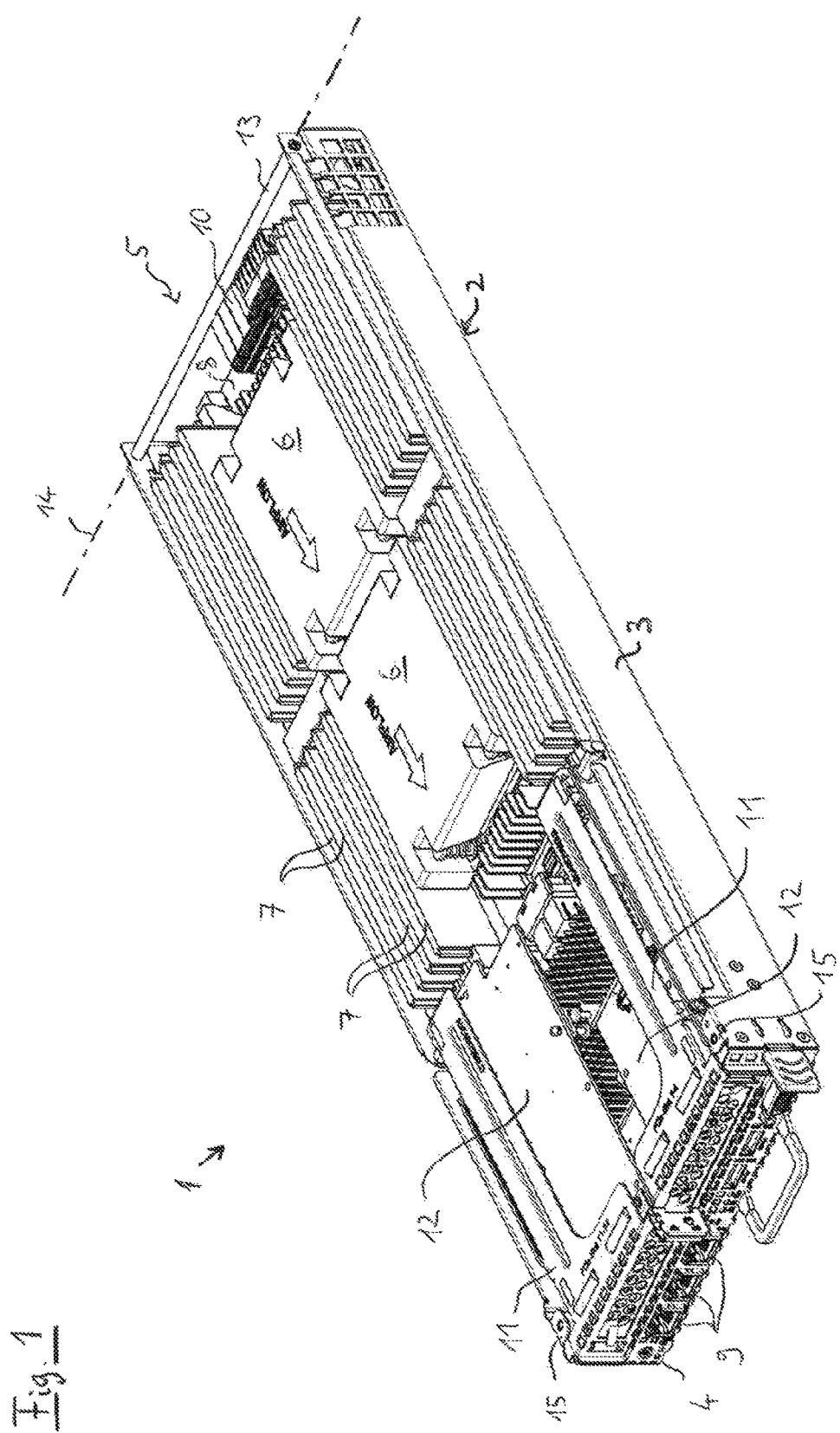

| | | | |
|---|---|---|---|
| 7,272,013 B1* | 9/2007 | Sivertsen | H05K 7/1487 174/520 |
| 7,821,790 B2* | 10/2010 | Sharma | H05K 7/1424 361/725 |
| 9,304,557 B2* | 4/2016 | Herman | G06F 1/181 |
| 9,681,572 B2* | 6/2017 | Artman | H05K 7/1487 |
| 2002/0081890 A1* | 6/2002 | Obermaier | H05K 7/1451 439/377 |
| 2002/0096980 A1* | 7/2002 | Montagna | G06F 1/184 312/223.1 |
| 2003/0022530 A1* | 1/2003 | Clements | G06F 1/184 439/61 |
| 2003/0045155 A1* | 3/2003 | Barringer | H05K 7/1424 439/377 |
| 2004/0001320 A1* | 1/2004 | Baar | H05K 7/1424 361/727 |
| 2005/0030720 A1 | 2/2005 | King et al. | |
| 2005/0257232 A1 | 11/2005 | Hidaka | |
| 2011/0128687 A1 | 6/2011 | Chen et al. | |
| 2013/0027875 A1 | 1/2013 | Zhu et al. | |

FOREIGN PATENT DOCUMENTS

| | | |
|---|---|---|
| DE | 102009025984 | 4/2011 |
| DE | 102010027893 | 10/2011 |
| DE | 102011113068 | 2/2013 |

* cited by examiner

ASSEMBLY FOR SECURING AT LEAST ONE EXPANSION CARD AND SERVER SYSTEM

The invention relates to an assembly for securing at least one expansion card to or in a server module having a half-open chassis. Furthermore, the invention relates to a server system comprising a carrier chassis for receiving a plurality of modules having a half-open chassis.

Many assemblies for securing expansion cards are known from the prior art. It is known, in particular, to electrically connect expansion cards to corresponding plug connectors of a system circuit board of a personal computer according to different form factors and connections, e.g. according to the Industry Standard Architecture (ISA), Vesa Local (VL) bus, Peripheral Component Interconnect (PCI) or rather the PCI Express standard, and to secure said cards to a slot area of the computer by means of a support bracket.

Further configurations for computer systems, in particular server systems, are known from the prior art to further increase the computing density of computer systems. For example, in the prior art, server modules having half-open chassis are known, which can be inserted in corresponding reception openings of a carrier chassis. Due to its partially open casings, such systems are also referred to as "skinless servers".

In such server systems, due to the high component density, the reception of expansion cards is not possible or only possible to a limited extent. In particular, these cards can not directly, i.e. perpendicularly, be plugged to a system circuit board of the server module, because the mounting space provided is not sufficient to that end. As far as mounting of individual, particularly small or offset expansion cards is intended, securing these cards to the server module regularly requires significant efforts.

It is an object of the present invention to describe a securing assembly for a server module having a half-open chassis, which allow a particularly simple and flexible securing of one or multiple expansion cards. Preferably, the assembly is to be suitable for mounting without tools.

According to a first aspect of the invention, an assembly for securing an expansion card is disclosed. The assembly comprises a half-open chassis for receiving a first circuit board of a server module having at least one first plug connector. Furthermore, the assembly comprises a carrier component for receiving at least one expansion card, wherein the carrier component comprises at least one securing point for releasably and rotatably receiving the carrier component on the half-open chassis and at least one first bearing surface for supporting the carrier component at a second bearing surface of the half-open chassis. The securing point and the first bearing surface are arranged in a region of opposite ends of the carrier component. The assembly further comprises at least one second circuit board secured to the carrier component having at least one first mating plug connector for electrically contacting the first plug connector and at least one second plug connector for electrically contacting a second mating plug connector of an expansion card. Here, the mating plug connector is arranged in the region of the end of the carrier component where the first bearing surface is located, so that the second circuit board is electrically connected to the first circuit board by receiving and pivoting the carrier component around the securing point in the direction of the second bearing surface.

The assembly according to the first aspect combines a mechanic carrier component, which can be secured to or in a half-open chassis in a simple manner by unilaterally joining it to a securing point and pivoting around a rotatable reception arranged there. Here, an electric connection is simultaneously established between an expansion card to be received and a circuit board of a half-open chassis via the second circuit board, so that electric and mechanic connection can be effected in one step. In conjunction with the reception of the half-open chassis of the server module in a carrier chassis, a further securing of the expansion card, the carrier component or the second circuit board may be omitted, so that basically mounting without tools is possible.

In at least one embodiment, the releasable and rotatable reception is realized by an axis of rotation arranged in a receiving shoe. Such an assembly can be easily produced and allows a mechanically-secure fastening of the carrier component to or in the half-open chassis.

In particular card edge connectors or gilded pin contacts, respectively, are suitable for the first plug connector and mating plug connector. The second plug connector is particularly suitable for receiving expansion cards according to the PCIe standard.

In at least one embodiment, the second circuit board comprises at least one third plug connector for the contacting of a third mating plug connector of a third circuit board for supplying power to the at least one expansion card independently from the first circuit board. For example, the second circuit board can directly contact a so-called backplane or midplane of a carrier chassis for the server module, to supply expansion cards that have a high power consumption with an operating voltage, independently from the server module.

Optionally, the carrier component can be secured to the half-open chassis in the region of the first bearing surface in the pivoted state by means of a screw.

The described assembly is suitable both for securing external expansion cards at least partially outside the half-open chassis and for receiving internal expansion cards inside a half-open chassis.

In particular in the case of external expansion cards, the carrier component per se can be designed as half-open, in particular U-shaped expansion chassis that at least partially surrounds the at least one expansion card. This assembly allows expansion of a server module to neighboring reception positions of a carrier chassis, wherein the half-open configuration of the server module allows mechanically and electrically securing the expansion card in a chassis of the expansion module.

According to a second aspect, a server system is described, which comprises a carrier chassis for receiving a plurality of modules, in particular server modules and expansion modules. The server system comprises a circuit board received in the carrier chassis for electrically contacting the plurality of modules, at least one server module received in the carrier chassis having a first half-open chassis and at least one expansion module received in the carrier chassis having a second half-open chassis. Here, at least one external expansion card for the server module is arranged in the expansion module, wherein the second half-open chassis of the expansion module is pivotably secured to the first half-open chassis of the server module.

The described server system allows a simple electrical and mechanical securing of an expansion module to a server module.

Further advantageous embodiments are indicated in the dependent claims as well as in the following description of different exemplary embodiments.

Figure 2:
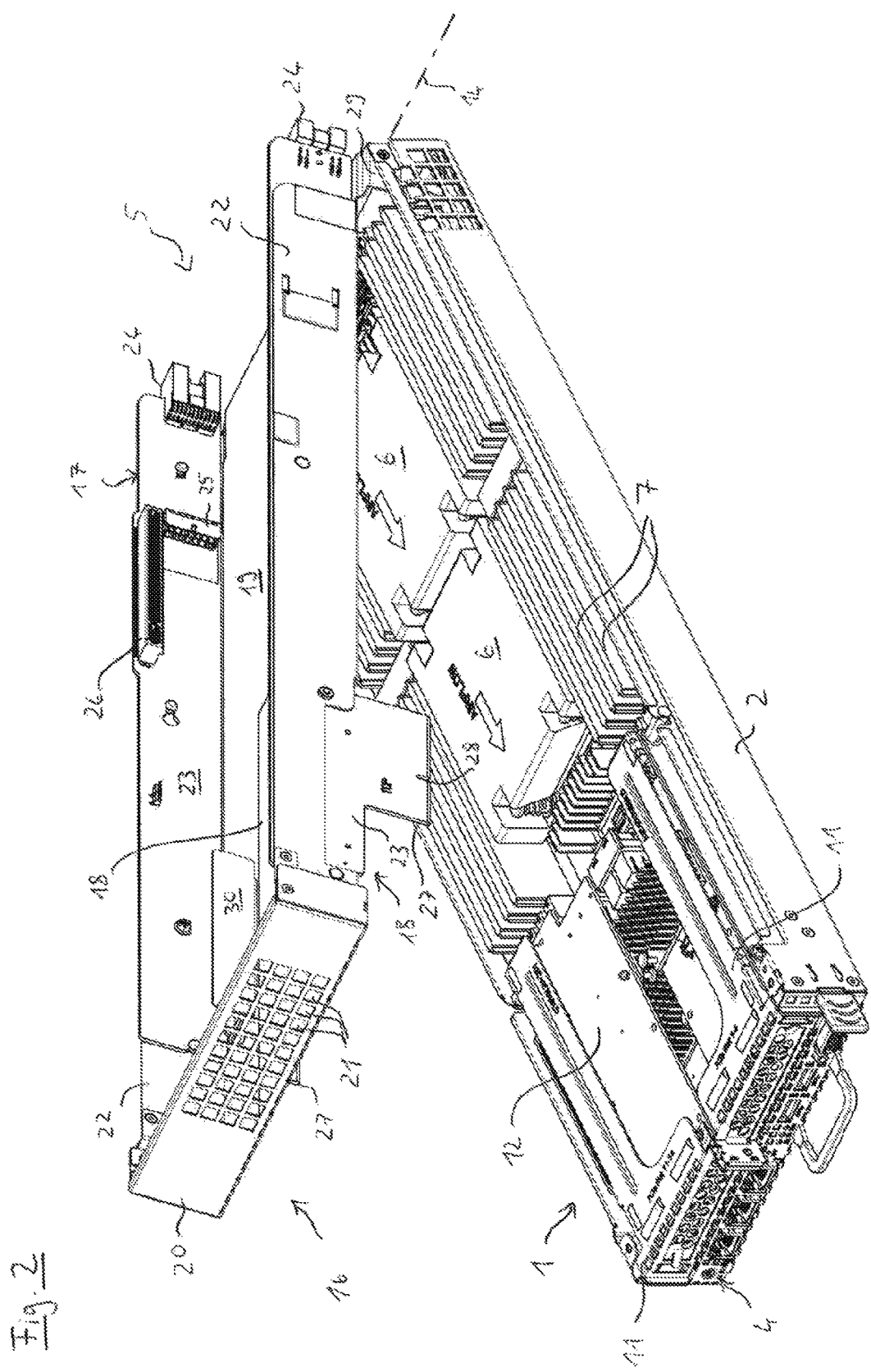
Figure 3:
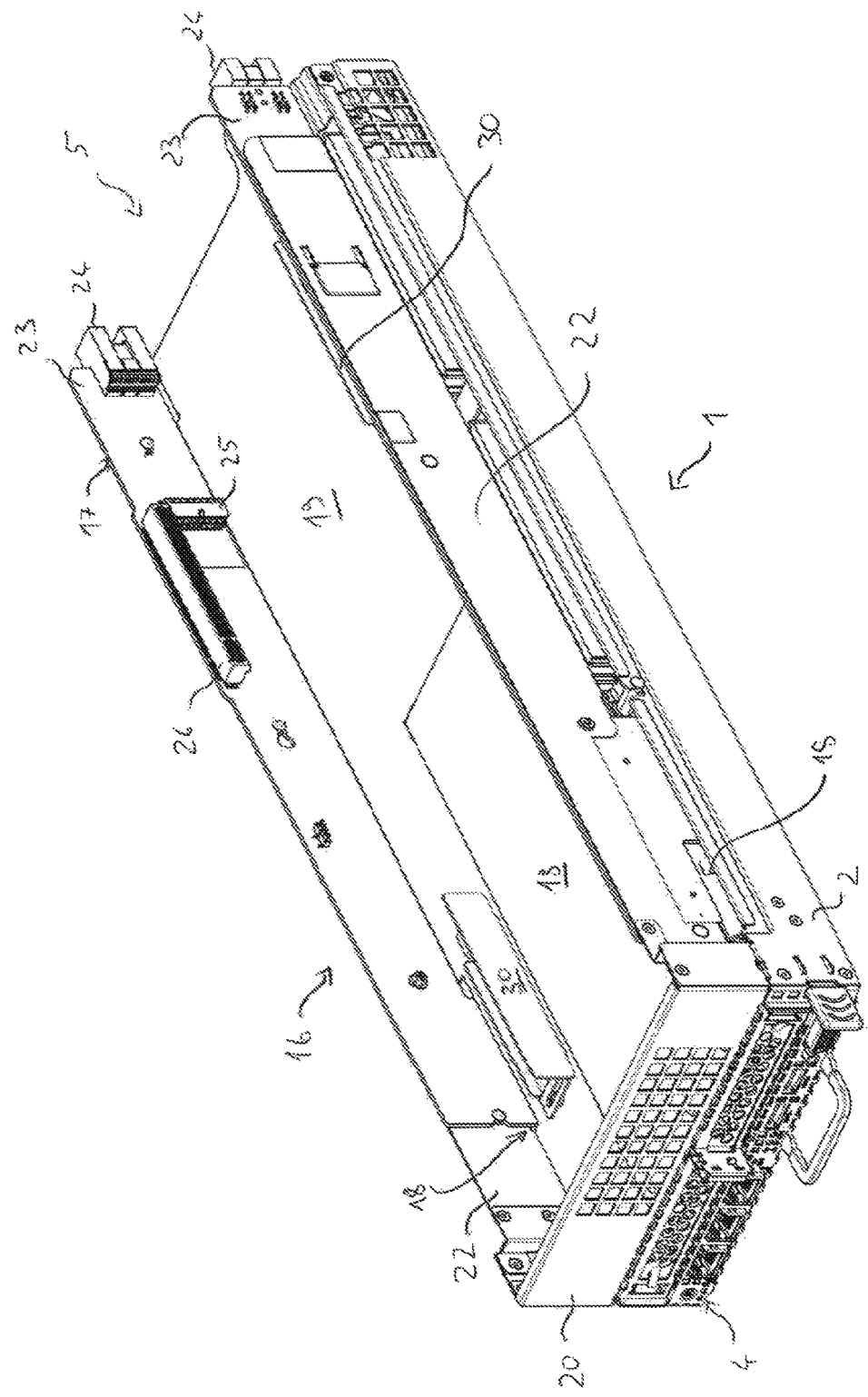
Figure 5:
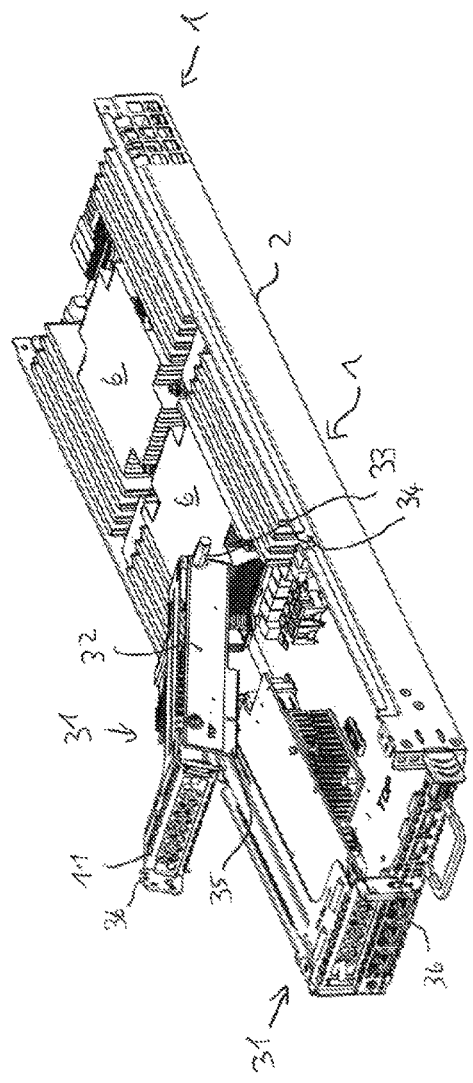
Figure 4:
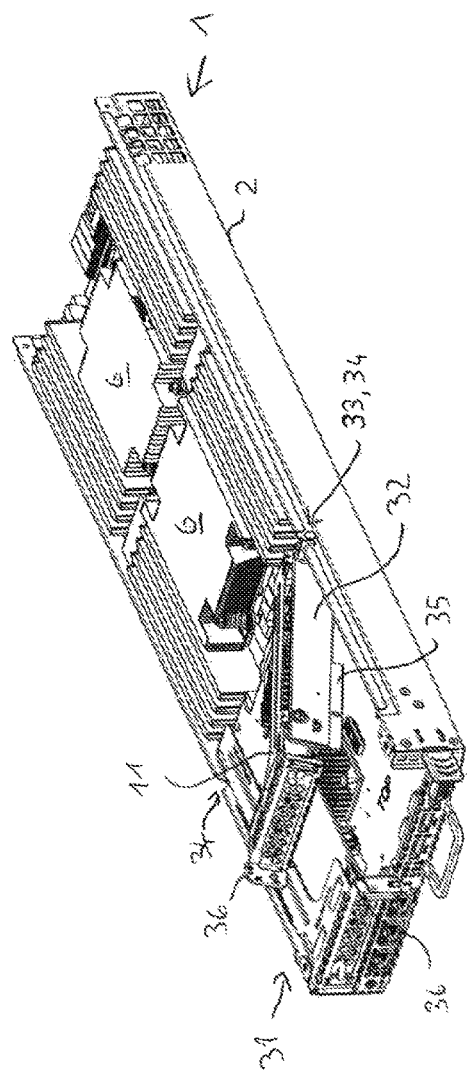

Hereinafter, the invention will be described in detail with reference to FIGS. 1 to 5 by means of two exemplary embodiments. The figures show in:

FIG. 1 a server module having a half-open chassis,

FIGS. 2 and 3 mounting an expansion module for external expansion cards according to a first exemplary embodiment, and FIGS. 4 and 5 dismounting an internal expansion card according to a second exemplary embodiment.

FIG. 1 shows a server module 1 suitable for the reception in a carrier chassis not shown in the figures. The server module 1 comprises a half-open chassis 2 made of steel sheet or another suitable material. In the exemplary embodiment, the half-open chassis 2 is a substantially U-shaped sheet metal part. The half-open chassis 2 surrounds components received in the server module 1 by means of a bottom wall (concealed in FIG. 1) and two opposite side walls 3. However, the chassis 2 is largely freely accessible to the upper side as well as in the direction of a front side 4 as well as a rear side 5. An electric shielding in these regions is ensured partially by an assembly of the server module 1 in a carrier chassis and partially by inserting further components and modules in the chassis 2 or neighboring reception slots of the carrier chassis.

Such systems are also called "skinless servers", as the server module 1 per se comprises an incomplete casing only. In the present application, each chassis that does not allow for a complete electrical shielding or comprises openings enabling direct contacting of circuit boards arranged inside the chassis or other components is referred to as half-open.

The server module 1 according to FIG. 1 comprises different components of a server computer. In the illustration according to FIG. 1, two cooling devices 6 for processors arranged below, altogether sixteen storage modules 7 as well as further system components arranged on a first circuit board 8 can be discerned. Accordingly, the first circuit board 8 is also called system board or mainboard. Furthermore, connections 9 accessible from outside the chassis 2 for connecting the server module 1 to external devices, in particular network switches or similar communication equipment, are arranged on the first circuit board 8. Furthermore, a module connection 10 which serves for connecting the server module 1 to a midplane of the carrier chassis is arranged on the circuit board 8. An operating voltage is provided for the server module 1 via the module connection 10.

Furthermore, it can be discerned in FIG. 1 that two carrier components 11 are arranged in the front region of the half-open chassis 2. Each of the carrier components 11 is equipped with an internal expansion card 12. Insertion and removal, respectively, of an internal expansion card 12 by means of the carrier components 11 is described in detail in conjunction with FIGS. 4 and 5.

Finally, securing points for receiving an external expansion module not illustrated in FIG. 1 can be discerned in FIG. 1. A metal rod 13 screwed between the side walls 3 of the chassis 2 serves to that end, the rod forming an axis of rotation 14 for receiving the expansion module. Furthermore, in the front region of the chassis 2, two metal tabs are bent from the side walls 3 to the inside, the tabs serving as a bearing surface 15 for the expansion module. Hereinafter, mounting the expansion module is described in conjunction with FIGS. 2 and 3.

FIG. 2 shows the server module 1 according to FIG. 1 with the expansion module 16 joined thereto. The expansion module 16 also comprises a half-open chassis 17. The half-open chassis 17 is designed as a substantially U-shaped steel sheet part as well. Here, the chassis 17 comprises three openings 18 on its bottom side 19, which serve, as will be described later, inter alia, for electrically contacting components of the server module 1.

The half-open chassis 17 of the expansion module 16 comprises a shielding plate 20 on the front side 4, which secludes it to the front. For cooling the components arranged in the chassis 17, a plurality of vent openings 21 is formed in the shielding plate 20.

In each case one second circuit board 23 is secured to two side walls 22 of the chassis 17 by means of screws. Different plug connectors are arranged on the second circuit boards 23. In particular, each of the circuit boards 23 comprises a module connection 24 in the rear region for connecting the circuit boards 23 to a midplane of a carrier chassis for the power supply. Furthermore, a power supply connection 25 as well as a plug connector 26 are arranged on each of the circuit boards 23. The plug connectors 26 are configured as PCIe connectors and serve for electrically and mechanically receiving external expansion cards not illustrated in FIG. 2 in the expansion module 16. For example, two particularly powerful expansion cards, such as in particular high performance computing cards and graphics and array co-processor cards, respectively, can be received in the expansion module 16 and supplied with an operating voltage via the power supply connection 25 independently from the server module 1.

To establish a data connection between the expansion cards received in the plug connectors 26 and the server module 1, the circuit boards 23 protrude from the half-open chassis 17 through in each case one of the openings 18 downward to the outside. On the bottom end of the circuit boards 23, so-called gilded pin contacts are provided, which together form a mating plug connector 27 for the insertion in a plug connector of the first circuit board 8 concealed in FIG. 2 of the first server module 1. Besides the actual electric connectors, the mating plug connector 27 comprises a coding 28 configured as a slot, which ensures a correct positioning of the individual contacts.

The mating plug connector 27 is located at relatively large physical distance to the axis of rotation 14 formed by the metal rod 13. In this way, it is ensured that the mating plug connector 27 immerges at a very small angle in the corresponding plug connector in the form of a circuit board side plug of the first circuit board 8 upon pivoting the expansion module 16 relative to the server module 1 of the mating plug connector 27. This angle is small enough to fall within the tolerances of the circuit board side plug. Accordingly, the second circuit boards 23 can be connected to the first circuit board 8 of the server module 1 by joining the receiving shoes 29 arranged on the rear end of the half-open chassis 17 of the expansion module 16 to the metal rod 13 and subsequently rotating the expansion module around the axis of rotation 14.

Here, in the completely pivoted state, bearing surfaces of the chassis 17 of the expansion module touch the bearing surfaces 15 of the chassis 2 of the server module 1. This state is illustrated in FIG. 3.

Furthermore, it can be discerned in FIG. 3 that additional two fastening elements 30 are arranged in the half-open chassis 17 of the expansion module 16, which serve for mechanically securing expansion cards received in the plug connectors 26 in a secure manner. In the exemplary embodiment, the expansion module 16 is configured to receive two expansion cards arranged twisted to one another. The circuit board 23 serves for receiving an expansion card with a printed circuit board in the left side wall 22, the components of which are arranged on the bottom side. On the other hand, the circuit board 23 secured to the right side wall 22 serves for receiving an expansion card in the opposite direction, i.e. with the components arranged thereon on the top.

Although not illustrated in FIG. 3, the expansion cards can be received in the plug connectors 26 prior to joining and pivoting the expansion modules 16. Thus, it is possible to connect a ready-made expansion module 16 together with expansion cards received therein in a position parallel to the server module 1 by angled-off joining to the server module 1 and pivoting the expansion module 16.

In FIGS. 4 and 5, removal of one of the carrier components 11 with an internal expansion card 12 secured thereto is illustrated. The assemblies 31 for securing the internal expansion card 12 shown in FIGS. 1, 4 and 5 illustrate a further exemplary embodiment of the present invention.

Each of the assemblies 31 for securing the internal expansion card 12 comprises, besides the carrier component 11, a third circuit board 32 secured thereto. In the exemplary embodiment, the carrier components 11 are configured in the form of a metal bracket having sheet-metal tabs projecting outward, which rest on the side walls 3 of the half-open chassis 2. The third circuit board 32 is screwed to two further metal tabs of the carrier component 11. A first screw connection is established by means of a conventional screw. A second screw connection is established by means of a protruding threaded bolt 33. The protruding threaded bolt 33 has a bolt head with a circumferential groove for the rotatably-supported reception in a corresponding receiving shoe 34 of the side wall 3. By means of the threaded bolt 33, the carrier component 11 with the third circuit board 32 secured thereto and the internal expansion card 12 received in a plug connector of the circuit board 32 can be folded out of the server module 1, as illustrated in FIG. 4. Subsequently, the carrier component 11 can be removed from the receiving shoe 34 by releasing the threaded bolt 33, as illustrated in FIG. 5.

Just as well, in the assemblies 31 for securing the internal expansion cards 12 according to FIGS. 4 and 5, the distance between the threaded bolt 33 serving as an axis of rotation and a mating plug connector 35 in the form of gilded pin contacts was selected to be as large as possible. In this way, the establishment or separation of the electric connection between the gilded pin contacts of the third circuit board 32 and a corresponding plug connector of the first circuit board 8 is effected almost perpendicularly to the first circuit board 8. Furthermore, the two internal expansion cards 12 of the left or right securing assembly 31 are received twisted to one another, so that in one expansion card 12, the fitting side of the first circuit board is directed upward, i.e. in the same direction as the fitting side of the first circuit board 8, and in the other expansion card 12 in the opposite downward direction. In this way, securing standard-conformant internal expansion cards 12 to the carrier components 11 designed in a largely mirror-symmetric manner is possible by means of support brackets 36.

The different features of the described exemplary embodiments can be combined in various ways to achieve the respective advantage. In particular, the securing of the carrier components 11 to a continuous metal rod of the half-open chassis 2 would be possible. On the other hand, threaded bolts for securing to corresponding receiving shoes of the first half-open chassis 2 could be provided on the second half-open chassis 2. Furthermore, other suitable plug connectors are feasible besides the described PCIe plug connectors as well as the gilded pins plugs or circuit board edge connectors.

LIST OF REFERENCE NUMERALS 1 server module
2 half-open chassis (of the server module)
3 side wall (of the server module)
4 front side
5 rear side
6 cooling device
7 storage module
8 (first) circuit board
9 connection
10 module connection (of the server module)
11 carrier component (for internal expansion card)
12 (internal) expansion card
13 metal rod
14 axis of rotation
15 bearing surface
16 expansion module
17 half-open chassis (of the expansion module)
18 opening
19 bottom side
20 shielding plate
21 vent opening
22 side wall (of the expansion module)
23 (second) circuit board
24 module connection (of the expansion module)
25 power supply connection
26 plug connector
27 mating plug connector (of the second circuit board)
28 coding
29 receiving shoe (of the expansion module)
30 fastening element
31 assembly
32 (third) circuit board
33 threaded bolt
34 receiving shoe (of the server module)
35 mating plug connector (of the third circuit board)
36 support bracket

The invention claimed is:

1. An assembly for securing at least one expansion card, comprising:
   a half-open chassis for receiving a first circuit board of a server module having at least one first plug connector;
   a carrier component for receiving at least one expansion card, wherein the carrier component comprises at least one securing point for rotatably and releasably receiving the carrier component on the half-open chassis and at least one first bearing surface for supporting the carrier component on a second bearing surface of the half-open chassis, which are arranged in the region of opposite ends of the carrier component; and
   at least one second circuit board secured to the carrier component having at least one first mating plug connector for electrically contacting the first plug connector and at least one second plug connector for electrically contacting a second mating plug connector of an expansion card, wherein the first mating plug connector is arranged in the region of the end of the carrier component where the first bearing surface is located, so that the second circuit board is electrically connected to the first circuit board by receiving and pivoting the carrier component about the securing point in the direction of the second bearing surface.

2. The assembly according to claim 1, further comprising at least one axis of rotation and at least one receiving shoe for receiving the axis of rotation, wherein the first securing point of the carrier component is rotatably secured to the half-open chassis by receiving the axis of rotation in the at least one receiving shoe.

3. The assembly according to claim 1, in which the first plug connector and the first mating plug connector are designed as card edge connectors or as gilded pin contacts.

4. The assembly according to claim 1, in which the carrier component and/or the second plug connector are designed for receiving an expansion card according to PCIe standard.

5. The assembly according to claim 1, in which the second circuit board comprises at least one third plug connector for the contacting of a third mating plug connector of a third circuit board for the power supply of the at least one expansion card independently from the first circuit board.

6. The assembly according to claim 1, in which a screw for securing the carrier component on the half-open chassis is arranged in the region of the first bearing surface.

7. The assembly according to claim 1, in which the carrier component and the second circuit board for receiving an external expansion card in the pivoted state are arranged at least partially outside the half-open chassis.

8. The assembly according to claim 7, in which the carrier component is designed as a second, in particular U-shaped chassis, that surrounds the at least one external expansion card at least partially.

9. The assembly according to claim 1, in which the carrier component and the second circuit board for receiving an internal expansion card in a pivoted state are arranged completely inside the half-open chassis.

10. A server system, comprising:
   a carrier chassis for receiving a plurality of electrical modules, the plurality of electrical modules comprising at least server modules and expansion modules;
   a circuit board, received in the carrier chassis, for electrically contacting the plurality of electrical modules;
   at least one server module, received in the carrier chassis, with a first half-open chassis; and
   at least one expansion module, received in the carrier chassis, with a second half-open chassis;
   wherein at least one external expansion card for the server module is arranged in the expansion module, and the second half-open chassis of the expansion module is pivotably secured to the first half-open chassis of the server module.

11. The server system according to claim 10, wherein the second half-open chassis of the expansion module comprises at least one securing point for rotatably and releasably receiving the second half-open chassis on the first half-open chassis of the at least one server module and at least one first bearing surface for supporting the second half-open chassis on a second bearing surface of the first half-open chassis, wherein the at least one securing point and the at least one first bearing surface are arranged in the region of opposite ends of the second half-open chassis.

12. The server system according to claim 11, wherein the at least one server module comprises a first circuit board having at least one first plug connector, and wherein the at least one expansion module comprises at least one second circuit board secured to the second half-open chassis, the at least one second circuit board comprising at least one first mating plug connector for electrically contacting the first plug connector of the first circuit board and at least one second plug connector for electrically contacting a second mating plug connector of the at least one expansion card arranged in the at least one expansion module, wherein the at least one first mating plug connector is arranged in the region of the end of the second half-open chassis, where the first bearing surface is located, so that the second circuit board is electrically connected to the first circuit board by receiving and pivoting the second half-open chassis about the securing point in the direction of the second bearing surface.

13. The server system according to claim 12, wherein the second half-open chassis and/or the second plug connector are designed for receiving at least one expansion card according to PCIe standard.

14. The server system according to claim 10, wherein the first half-open chassis of the at least one server module further comprises a rod forming an axis of rotation, and wherein the second half-open chassis of the at least one expansion module further comprises two receiving shoes for receiving the rod, wherein the second half-open chassis is rotatably secured to the first half-open chassis by receiving the rod in the two receiving shoes.

15. The server system according to claim 10, wherein the second half-open chassis is designed as a U-shaped chassis, that surrounds the at least one expansion card at least partially.

16. A server module, comprising
   a first circuit board having at least one first plug connector;
   at least one expansion card;
   a half-open chassis for receiving the first circuit board;
   a carrier component for receiving the at least one expansion card, wherein the carrier component comprises at least one securing point for rotatably and releasably receiving the carrier component on the half-open chassis and at least one first bearing surface for supporting the carrier component on a second bearing surface of the half-open chassis, which are arranged in the region of opposite ends of the carrier component; and
   at least one second circuit board secured to the carrier component having at least one first mating plug connector for electrically contacting the first plug connector and at least one second plug connector for electrically contacting a second mating plug connector of the at least one expansion card, wherein the first mating plug connector is arranged in the region of the end of the carrier component where the first bearing surface is located, so that the second circuit board is electrically connected to the first circuit board by receiving and pivoting the carrier component about the securing point in the direction of the second bearing surface.

17. The server module according to claim 16, wherein the half-open chassis further comprises at least one rod forming an axis of rotation, and wherein the carrier component further comprises at least one receiving shoe for receiving the rod, wherein the first securing point of the carrier component is rotatably secured to the half-open chassis by receiving the rod in the at least one receiving shoe.

18. The server module according to claim 16, wherein at least one expansion card comprises at least one PCIe expansion card and the carrier component and/or the second plug connector are designed for receiving the at least one PCIe expansion card.

19. The server module according to claim 16, wherein the carrier component, the second circuit board, and the at least one expansion card are arranged, in a connected state, at least partially outside the half-open chassis.

20. The server module according to claim 16, wherein the carrier component, the second circuit board, and the at least one expansion card are arranged, in a connected state, completely inside the half-open chassis.

* * * * *